US010574226B2

(12) United States Patent
Narayanasamy et al.

(10) Patent No.: US 10,574,226 B2
(45) Date of Patent: Feb. 25, 2020

(54) GATE DRIVER INCLUDING GATE SENSE CIRCUIT

(71) Applicant: TEXAS INSTRUMENTS INCORPORATED, Dallas, TX (US)

(72) Inventors: Navaneeth Kumar Narayanasamy, Coimbatore (IN); Salil Chellappan, Bangalore (IN); Apoorva Awasthy, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 1 day.

(21) Appl. No.: 15/896,952

(22) Filed: Feb. 14, 2018

(65) Prior Publication Data

US 2018/0234088 A1 Aug. 16, 2018

Related U.S. Application Data

(60) Provisional application No. 62/611,329, filed on Dec. 28, 2017.

(30) Foreign Application Priority Data

Feb. 16, 2017 (IN) .............................. 201741005515

(51) Int. Cl.
*H03K 17/0812* (2006.01)
*H03K 17/0814* (2006.01)
*H02H 3/08* (2006.01)
*H02H 7/20* (2006.01)

(52) U.S. Cl.
CPC ......... *H03K 17/08122* (2013.01); *H02H 3/08* (2013.01); *H02H 7/20* (2013.01); *H03K 17/08128* (2013.01); *H03K 17/08142* (2013.01)

(58) Field of Classification Search
CPC ............... H02H 3/00–52; H02H 3/087; H03K 17/00–98
See application file for complete search history.

(56) References Cited

U.S. PATENT DOCUMENTS

| | | | |
|---|---|---|---|
| 9,490,794 B1* | 11/2016 | Zhang | H03K 17/0828 |
| 2004/0252432 A1* | 12/2004 | Sasaki | B60K 6/485 |
| | | | 361/91.1 |
| 2005/0258889 A1* | 11/2005 | Tolle | H02M 1/38 |
| | | | 327/374 |
| 2007/0170975 A1* | 7/2007 | Miettinen | H03K 17/168 |
| | | | 327/377 |
| 2007/0257725 A1* | 11/2007 | De | H03K 17/08128 |
| | | | 327/379 |

(Continued)

FOREIGN PATENT DOCUMENTS

EP 0561386 A1 * 9/1993 ....... H03K 17/08128

*Primary Examiner* — Thienvu V Tran
*Assistant Examiner* — Christopher J Clark
(74) *Attorney, Agent, or Firm* — Tuenlap Chan; Charles A. Brill; Frank D. Cimino (57) ABSTRACT

In some examples, a gate driver includes a gate sense pin and a gate sense circuit configured to couple to a node of a transistor via the gate sense pin. The gate sense circuit includes an overcurrent detection circuit configured to detect a first fault condition based on the node before the transistor turns on in a soft switching mode. The gate sense circuit also includes a Miller plateau detection circuit configured to detect a second fault condition based on the node when the transistor is turning on in a hard switching mode.

20 Claims, 4 Drawing Sheets

(56) References Cited

U.S. PATENT DOCUMENTS

| | | | |
|---|---|---|---|
| 2013/0162322 A1* | 6/2013 | Tao | H03K 17/04123 327/381 |
| 2013/0187656 A1* | 7/2013 | Barrenscheen | H03K 17/28 324/415 |
| 2014/0292395 A1* | 10/2014 | Wu | H01L 21/28264 327/434 |
| 2015/0116006 A1* | 4/2015 | Ferianz | H03K 17/04 327/109 |
| 2015/0372678 A1* | 12/2015 | Zhang | H03K 19/017509 327/109 |
| 2016/0013788 A1* | 1/2016 | Thalheim | H02H 3/08 361/101 |
| 2016/0124037 A1* | 5/2016 | Zhang | G01R 31/3275 324/762.08 |
| 2017/0040802 A1* | 2/2017 | Hopperdietzel | G01R 15/183 |
| 2017/0155322 A1* | 6/2017 | Zhang | H02M 1/36 |
| 2017/0272068 A1* | 9/2017 | Liang | H03K 17/567 |
| 2018/0034358 A1* | 2/2018 | Geske | H02M 1/08 |
| 2018/0115310 A1* | 4/2018 | Horiguchi | H02M 1/00 |
| 2018/0248543 A1* | 8/2018 | Senda | H02M 1/088 |
| 2018/0331678 A1* | 11/2018 | Kaneda | G01R 31/025 |
| 2019/0074827 A1* | 3/2019 | Norling | H01L 21/02472 |

* cited by examiner

GATE DRIVER INCLUDING GATE SENSE CIRCUIT

CROSS-REFERENCE TO RELATED APPLICATIONS

The present application claims priority to U.S. Provisional Patent Application No. 62/611,329, which was filed Dec. 28, 2017, is titled "Gate Driver Including Gate Sense Circuit," and Indian Provisional Patent Application No. 201741005515, which was filed Feb. 16, 2017, is titled "IGBT Short Circuit Protection Using Gate-Emitter (VGE) Voltage/Gate Current Signature," and is hereby incorporated herein by reference in its entirety.

BACKGROUND

Power transistor switches—because of their fast switching speed, their compatibility for parallel operation and their ability to handle high voltages—are widely used in power electronic applications, such as in motor drivers. Using high frequency switches is advantageous as they permit higher system frequencies and power densities.

SUMMARY

In accordance with some examples, a gate driver includes a gate sense pin and a gate sense circuit configured to couple to a node of a transistor via the gate sense pin. The gate sense circuit includes an overcurrent detection circuit configured to detect a first fault condition based on the node before the transistor turns on in a soft switching mode. The gate sense circuit also includes a Miller plateau detection circuit configured to detect a second fault condition based on the node when the transistor is turning on in a hard switching mode.

In accordance with some examples, a system includes a transistor includes a gate terminal, a collector terminal, and an emitter terminal, wherein the transistor comprises a first parasitic capacitor between the gate and the emitter terminals and a second parasitic capacitor between the gate and the collector terminals, wherein the first and second parasitic capacitors couple at a node. The system also includes a gate driver comprising an output pin and a gate sense pin, wherein the output pin couples to the gate terminal and the gate sense pin couples to the output pin and the gate terminal at the node, wherein the gate driver comprises a control logic circuit configured to determine whether the transistor is in a hard switching mode or a soft switching mode based on a signal at the node.

In accordance with some examples, a method includes blocking an output pin of a gate driver using a control logic circuit present in the gate driver; comparing, using the control logic circuit, a signal at a node to a first reference value, wherein the node is coupled to the output pin, a gate of a transistor, and a gate sense pin of the gate driver; enabling a Miller plateau detection circuit in response to the signal being higher than the first reference value; detecting an absence of a Miller plateau region in the signal at the node using the Miller plateau detection circuit; and in response to the detection of the absence of the Miller plateau region, providing a first fault signal to a fault pin of the gate driver by the Miller plateau detection circuit.

BRIEF DESCRIPTION OF THE DRAWINGS

For a detailed description of various examples, reference will now be made to the accompanying drawings in which.

DETAILED DESCRIPTION

Power transistors (switches—built using silicon or other wide band gap material) may be used in an inverter circuit that is used to convert an input direct current (DC) (e.g., DC voltage) to either an single phase or three phase alternating current (AC) output (e.g., AC voltage). In such an inverter circuit, each output phase of the three-phase AC output may couple to a pair of power transistors. In some cases, such a pair may include a high side transistor and a low side transistor. Typically, the gate terminal of each of the high side and the low side transistors is coupled to a gate driver, such that the gate driver is configured to provide a gate signal that may turn-on or turn-off its coupling transistor. To convert a DC input to a three-phase AC output, each of the gate drivers may take PWM signals from control logic (e.g., microcontroller). To perform such a function (DC to 3-phase AC conversion), the transistors may operate in a complementary manner, i.e., when the high side transistor conducts (is closed or ON state), the low side transistor does not conduct (is open or OFF state) such that the low side transistor blocks the DC voltage and vice versa. Switching between a high side transistor and a low side transistor, in each phase, facilitates the DC to 3-phase AC conversion.

In some cases, the transistors that are employed in the inverter application may be insulated-gate bipolar transistors (IGBT). In some cases, an IGBT may employ an anti-parallel diode (or a freewheeling diode) across it to conduct current in the reverse direction. In such transistors, switching between a high side transistor and a low side transistor may be characterized by two modes of switching, i.e., soft-switching and hard-switching. A transistor may be termed as being hard-switched (or being turned on in a hard-switched mode) when that transistor is turned on at a moment when a load current is flowing through the anti-parallel diode of the complementary transistor. A transistor is termed as being soft-switched (or being turned on in a soft-switched mode) when that transistor is turned on at a moment when load current flows through its anti-parallel diode. After a transistor is completely turned on (after either being soft or hard-switched), the transistor may conduct current in a mode often referred to as the steady-state mode. Although the foregoing description and the examples described below are presented in the context of IGBT, the scope of this disclosure is not limited to IGBT applications, and other types of transistors that are able to operate in hard and soft switching modes are included in the scope of this disclosure.

A fault condition (e.g., short circuit) may occur when a transistor is being turned on in a hard-switching mode and/or a soft-switching mode. In some cases, a short circuit condition may occur during the steady-state condition. In some cases, a fault condition may occur due to the breakdown of a transistor. In some cases, a fault condition may occur due to a faulty signal transmitted by a gate driver. In other cases, a fault condition may occur due to mis-wiring or load short circuit. In other cases, a fault condition may occur when any one of the inverter output wire shorts to ground. Typically, a transistor and other components in a power circuit need to be protected against these fault conditions. A typical response time for detecting and turning off the transistor under such a condition may be between 5-10 microseconds. In some classes of transistors, the response time may vary and can be less than 2 microseconds. Low response times may increase transistor reliability. Typically, a desaturation (DESAT) based protection circuit is used to detect fault conditions. DESAT based gate drivers are generally 16 pin drivers and may need extraneous circuitry to sense a voltage across a transistor, which may increase the overall footprint of the gate drive circuit on the PCB. Therefore, a new failure detection mechanism that mitigates the above-mentioned shortcomings of the DESAT based gate drivers is desired.

Accordingly, at least some examples disclosed herein are directed to systems and methods for identifying fault conditions that may occur in a power transistor based circuit. Specifically, the examples disclosed herein are directed to the identification of fault conditions in hard-switching, soft-switching, and steady state conditions. At least some of the examples disclosed herein utilize a gate driver that is configured to detect faults (e.g., short circuits) that may occur when a transistor is being turned on in a hard-switching mode. In some examples, this may be done by detecting a Miller plateau region (or sometimes referred to as "Miller region") that may develop at a transistor gate after a gate signal has been applied to the gate by the gate driver. This may be done by monitoring the gate to emitter voltage or gate current of the transistor. In some examples, the detection of a Miller plateau region may be done by monitoring the gate current or voltage at a node coupled to the transistor gate.

In at least some examples, the gate driver is also configured to identify a fault (e.g., overcurrent) condition that may occur when a transistor is being turned on in a soft-switching mode by monitoring a voltage across the transistor. This voltage may depend on the parasitic capacitances of the transistor—that is, capacitances that form due to transistor terminals that act as capacitor plates. In at least some examples, a fault (e.g., overvoltage) during the steady state condition of the transistor may be detected. This fault condition may be detected by monitoring the gate voltage at a node coupled to the transistor gate. The examples in this disclosure are directed towards an inverter driving a motor, but the principles disclosed can be applied to other types of converters, including transistors, and they can be applied to the driving of any type of load. The principles may apply particularly to transistors that are configured to function in soft-switching and hard-switching modes.

Figure 1A:
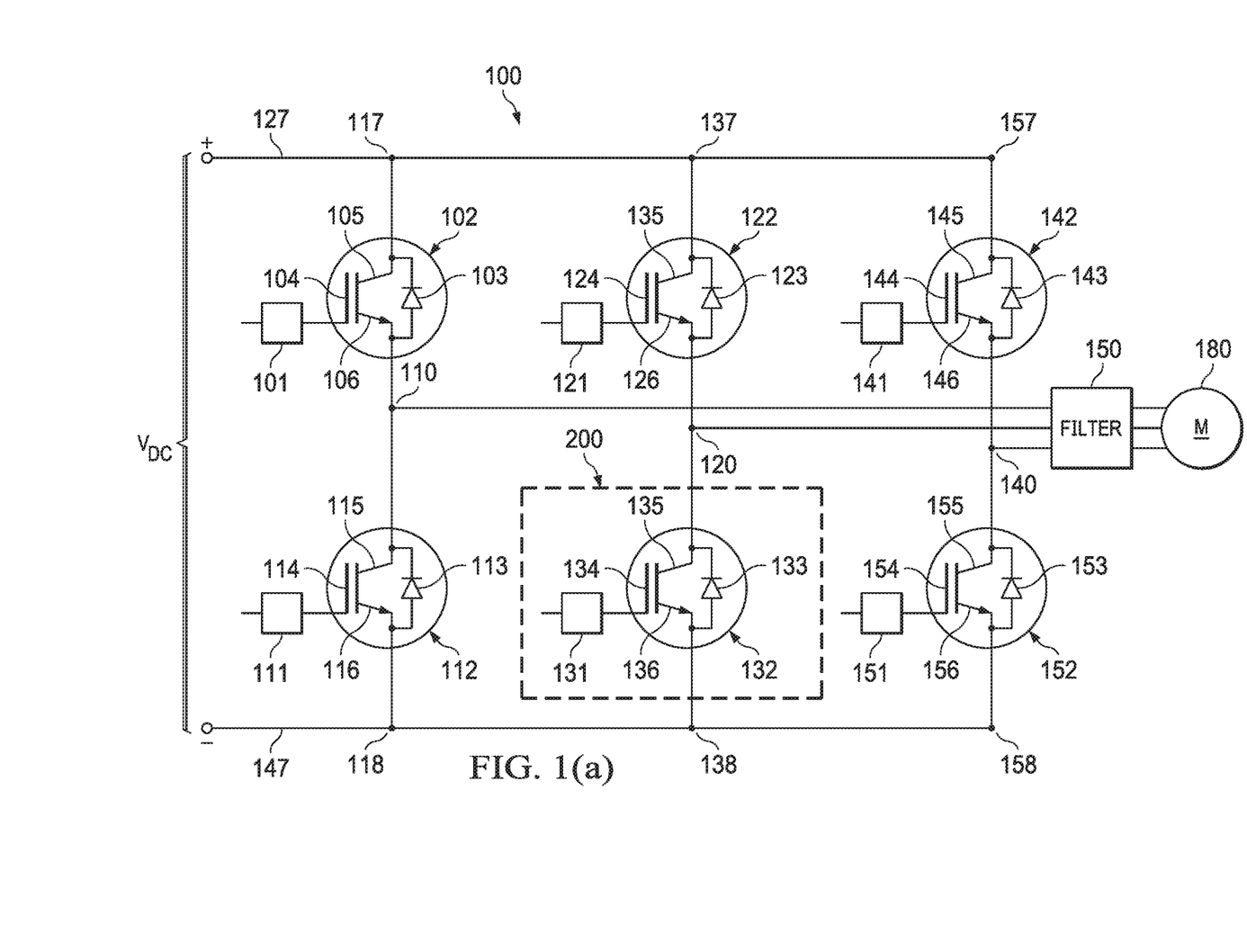
FIG. 1(a) depicts an illustrative three-phase inverter, in accordance with various examples.

FIG. 1(a) depicts an illustrative three-phase inverter 100 coupled to a motor 180. The three-phase inverter 100 is configured to convert a DC supply ($V_{DC}$) received at the wires 127, 147 to a three-phase signal delivered to the motor 180. The three-phase signal may be delivered through the wires connecting the nodes 110, 120, 140, with each node 110, 120, and 140 corresponding to one unique phase of the three-phase output. The three-phase inverter 100 includes a pair of IGBTs at each phase, for example, a first high side IGBT 102 and a first low side IGBT 112 outputs a first phase (of the three-phase AC output) at the output node 110. The first high side IGBT 102 and a first low side IGBT 112 couples to the wires 127, 147 at the nodes 117 and 118, respectively. Similarly, the three-phase inverter 100 includes a second pair of IGBTs that outputs a second phase (of the three-phase AC output) at the output node 120. The second pair may include a second high side IGBT 122 and a second low side IGBT 132 coupled to the wires 127, 147 at the nodes 137 and 138, respectively. Furthermore, the three-phase inverter 100 includes a third pair of IGBTs that outputs a third phase (of the three-phase AC output) at the output node 140. The third pair may include a third high side IGBT 142 and a third low side IGBT 152 coupled to the wires 127, 147 at the nodes 157 and 158, respectively.

The first high side IGBT 102 includes an emitter terminal 106, a collector terminal 105, a gate terminal 104, and an anti-parallel diode 103 coupled between the emitter terminal 106 and the collector terminal 105. The gate terminal 104 may be coupled to a gate driver 101. The first low side IGBT 112 includes an emitter terminal 116, a collector terminal 115, a gate terminal 114, and an anti-parallel diode 113 coupled between the emitter terminal 116 and the collector terminal 115. The gate terminal 114 may couple to a gate driver 111.

The second high side IGBT 122 includes an emitter terminal 126, a collector terminal 125, a gate terminal 124, and an anti-parallel diode 123 coupled between the emitter terminal 126 and the collector terminal 125. The gate terminal 124 may couple to a gate driver 121. The second low side IGBT 132 includes an emitter terminal 136, a collector terminal 135, a gate terminal 134, and an anti-parallel diode 133 coupled between the emitter terminal 136 and the collector terminal 135. The gate terminal 134 may couple to a gate driver 131.

The third high side IGBT 142 includes an emitter terminal 146, a collector terminal 145, a gate terminal 144, and an anti-parallel diode 143 coupled between the emitter terminal 146 and the collector terminal 145. The gate terminal 144 may couple to a gate driver 141. The third low side IGBT 152 includes an emitter terminal 156, a collector terminal 155, a gate terminal 154, and an anti-parallel diode 153 coupled between the emitter terminal 156 and the collector terminal 155. The gate terminal 154 may couple to a gate driver 151. The wires coupling the output nodes 110, 120, 140 to the motor 180 may include a filter 150. The filter 150 may include components such as inductors, capacitors.

The gate drivers 101, 111, 121, 131, 141, and 151 are configured to detect the modes in which the IGBTs 102, 112, 122, 132, 142, and 152 may turn-on. The gate drivers 101, 111, 121, 131, 141, and 151 are also configured to detect a fault condition that may occur while turning on an IGBT during the hard-switching mode using a Miller plateau region. Further, the gate drivers 101, 111, 121, 131, 141, and 151 are configured to detect a fault that may occur while turning on an IGBT in the soft-switching mode by monitoring the voltage across their respective collector (105, 115, 125, 135, 145, and 155) and emitter (106, 116, 126, 136, 146, and 156) terminals using the parasitic capacitors of the IGBTs 102, 112, 122, 132, 142, and 152, respectively. The gate drivers 101, 111, 121, 131, 141, and 151 are also configured to detect overvoltage conditions during a steady state condition by monitoring the gate voltage at the node coupling the gate drivers 101, 111, 121, 131, 141, and 151 to their respective transistor gates.

Figure 1B:
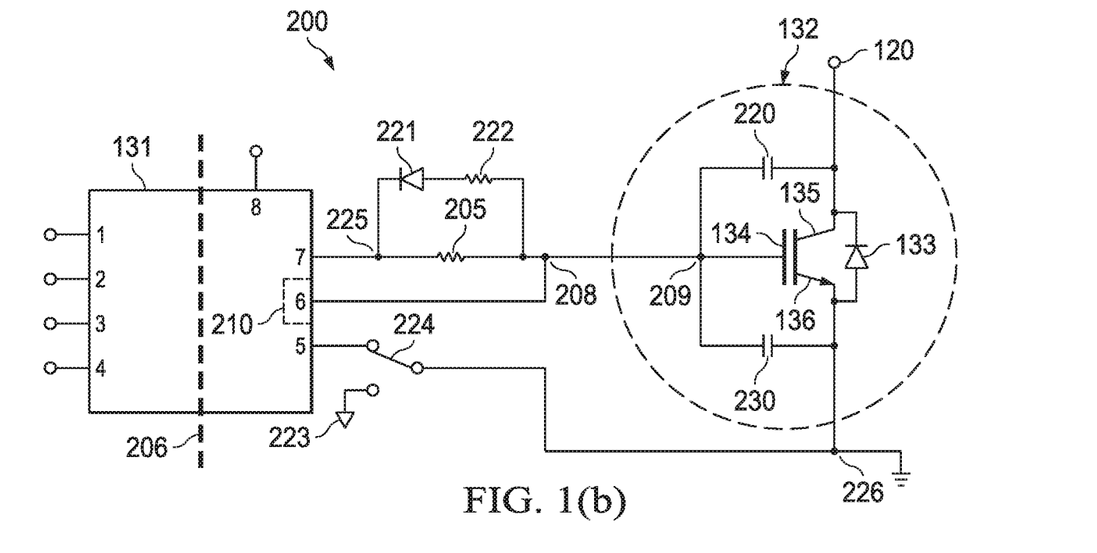
FIG. 1(b) depicts an illustrative portion of the three-phase inverter 100, in accordance with various examples.
Figure 1C:
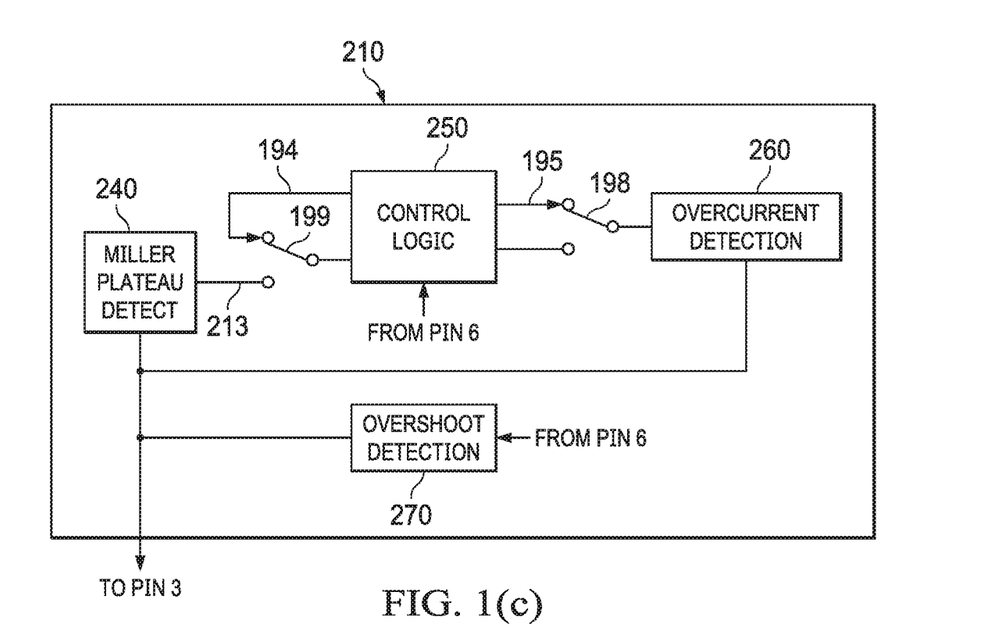
FIG. 1(c) depicts an illustrative gate sense circuit, in accordance with various examples.

FIG. 1(*b*) is an illustrative portion 200 of the three-phase inverter 100. The portion 200 depicts the low side IGBT 132 and its corresponding gate driver 131, but the principles of operation for the low side IGBT 132 also apply to the remainder of the three-phase inverter 100. It further depicts the emitter terminal 136, the collector terminal 135, the gate terminal 134, and the anti-parallel diode 133. The portion 200 also depicts the parasitic capacitors 220, 230, which are not discrete capacitor components but are capacitors that effectively form from the fabrication of the IGBT 132, i.e., the fabrication results in formation of terminals of the IGBT 132 that forms the parasitic capacitors. The parasitic capacitor 230 may include a parasitic capacitance (i.e., between the emitter terminal 136 and the gate terminal 134). The parasitic capacitor 220 may also include a parasitic capacitance between the collector terminal 135 and the gate terminal 134. In some examples, the emitter terminal 136 couples to the ground potential through the node 226. The portion 200 further depicts the gate driver 131 that includes 8-pins, with each pin serving a specific function. Pin 1 may be a positive input supply of the gate driver 131. Pin 2 may receive a PWM signal, which may dictate the turn-on and turn-off of the low side IGBT 132. Pin 3 may act as a fault pin, i.e., if there is a fault condition, pin 3 may provide a high output (e.g., digital "1" output). In contrast, if there is no fault condition, pin 3 may be signaled to turn low (e.g., digital "0" output). Pin 4 may serve the function of a ground terminal. The vertical line 206 through the gate driver 131 depicts an isolation barrier that may exist between the high voltage side of the inverter (pins 5, 6, 7, and 8, and the low voltage side of the inverter (pins 1, 2, 3, and 4). Pin 5 may be either connected to the emitter of the IGBT at node 226 or to a negative voltage 223 through switch 224. Pin 6 may act as the gate sense pin, i.e., pin 6 may be configured to detect the gate voltage at the node 208. Pin 7 may act as the output pin, i.e., the signal generated at pin 7 may drive the low side IGBT 132. The pin 7 may be coupled to a tri-state circuit (not expressly shown) that is configured to momentarily stop, or "block," the flow of a gate signal from pin 7, i.e., the tri-stating circuit may block pin 7 from driving the low side IGBT 132. The resistor 205 may be coupled to the pin 7 and the gate terminal 134. In some examples, a serially coupled diode 221 and a resistor 222 may also be connected to the pin 7, such that one end of the diode 221 couples to the pin 7 at the node 225 and one end of the resistor 222 couples the node 208. Pin 8 may act as a gate driver supply voltage (e.g., +15 V). The portion marked with numeral 210 depicts a gate sense circuit 210, which is now described with respect to FIG. 1(*c*).

FIG. 1(*c*) depicts the gate sense circuit 210, which may connect to the gate sense pin (i.e., pin 6) as shown in FIG. 1(*b*). The gate sense circuit 210 may include a Miller plateau detection (or "Miller plateau detect") circuit 240, an overcurrent detection circuit 260, an overshoot detection circuit 270, and a control logic circuit 250. In some examples, the control logic circuit 250 may couple to the miller plateau detect 240 via a switch 199 that is controlled by a signal sent by the control logic circuit 250 through a wire 194. The control logic circuit 250 may also couple to the overcurrent detection circuit 260 via a switch 198 that is controlled by a signal sent by the control logic circuit 250 through a wire 195. In some examples, a signal received at pin 6 may be provided to the control logic circuit 250. For example, following receiving a signal at pin 6, if the control logic circuit 250 determines that the low side IGBT 132 is being hard-switched, the control logic may enable the Miller plateau detection circuit 240 by closing the switch 199 using the wire 194 to detect a fault condition that may occur during the hard-switched turn-on mode. Similarly, if the control logic circuit 250 determines that the low side IGBT 132 is being soft-switched, the control logic circuit 250 may enable the overcurrent detection circuit 260 by closing the switch 198 using the wire 195 to detect a fault condition that may occur during the soft-switched turn-on mode. In some examples, the overshoot detection circuit 270 may continuously receive signal from pin 6 that may assist the overshoot detection circuit 270 in determining if a fault condition occurs when the low side IGBT 132 is in steady state (i.e., when the low side IGBT 132 is completely turned on).

The Miller plateau detection circuit 240, as further described below, may check for a fault condition that may occur while turning on the low side IGBT 132 under the hard-switching scenario. In this disclosure, the miller plateau detection circuit 240 is depicted to be coupled to pin 6. In other examples, a gate driver 131 may be adapted to couple the miller plateau detection circuit 240 at pin 7. The Miller plateau detection circuit 240 does so by monitoring the gate to emitter voltage at the node 208 (which is sensed at pin 6) for a presence or absence of a Miller plateau region (or Miller plateau). In some examples, the miller plateau region may also be sensed at pin 7. If a Miller plateau is detected, the gate driver 131 may allow the low side IGBT 132 to function under normal operating conditions, i.e., pin 7 will continue applying a voltage sufficient to completely turn-on the low side IGBT 132. However, if a Miller plateau is not detected, the Miller plateau detection circuit 240 may conclude that the low side IGBT 132 is in a fault condition (e.g., in a short circuit condition). Under the fault condition, the Miller plateau detection circuit 240 may send a fault signal to pin 3 and may further facilitate the turning off of the low side IGBT 132.

The overcurrent detection circuit 260, as further described below, may detect a fault condition before the low side IGBT 132 is turned on in the soft-switching mode. The fault condition may be identified by determining a voltage drop across the anti-parallel diode 133 (or the voltage drop across the collector 135 and emitter 136). Before the low side IGBT 132 is turned on, the voltage at the node 208 may be sensed. If this voltage drop is less than a predetermined value, the overcurrent detection circuit 260 may identify that the low side IGBT 132 is functioning in a fault condition. In such a condition, in some examples, a fault signal is generated by the overcurrent detection circuit, i.e., pin 3 may be signaled to turn high and the low side IGBT 132 may not be turned ON. However, if the voltage drop is above the pre-determined value or between a pre-determined range of values, the overcurrent detection circuit 260 may identify that the low side IGBT 132 is functioning in the soft-switching mode without a fault. In such a condition, the Miller plateau detect circuit 240 may be disabled and the low side IGBT 132 may be turned on.

As noted above, the overshoot detection circuit 270 receives the signal from pin 6 continuously. In such an example, the overshoot detection circuit 270 may detect a fault condition (e.g., short circuit condition) that may occur during the steady state condition (or "steady state mode") by monitoring the gate voltage at the node 208 (through pin 6). For example, if a fault condition arises, it may lead to a sharp increase in the gate voltage overshoot (i.e., the voltage at the node 208 may include one or more spikes). During this time, the gate voltage may increase higher than a pre-determined voltage value, thus leading to the generation of a fault signal at pin 3 and the turning-off of the low side IGBT 132.

Figure 2:
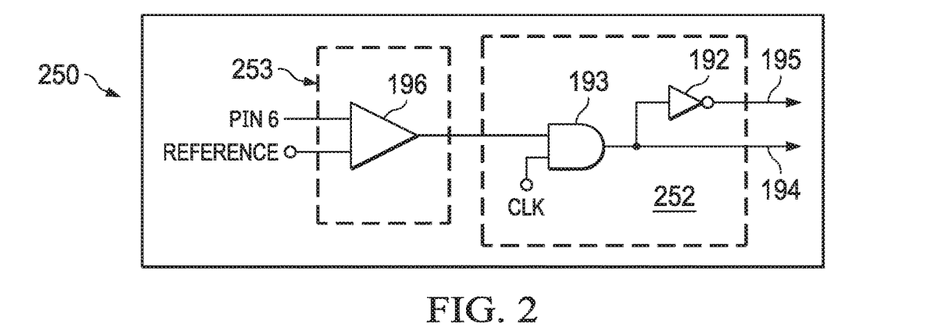
FIG. 2 depicts an illustrative control logic circuit, in accordance with various examples.

Refer now to FIG. 2, which depicts an illustrative control logic circuit 250. The illustrative control logic circuit 250 may include a comparator circuit 253 and an enable/disable circuit 252. The comparator circuit 253 may include a comparator 196 that is configured to receive a signal from pin 6, which is compared to a reference value. The enable/disable circuit 252 includes a logic gate 193 (e.g., AND gate) that receives the output of the comparator 196 and receives a clock signal. The logic gate 193 generates an output at wire 194. The clock signal may be a digital high ("1") signal when both the high and low side IGBT 122, 132, respectively, are open. The clock signal may be digital low ("0") signal when either of high and low side IGBT 122, 132 are closed. The circuit 252 may also include a logic gate 192 (e.g., NOT gate) that couples to the wire 194 and signals its output via wire 195. When both high side and low side IGBT 122, 132, respectively, are open, pin 7 is tri-stated, i.e., a gate signal is blocked from flowing from pin 7 to the gate 134, the voltage at the node 208 may be monitored by the comparator 196 to determine whether the low side IGBT 132 is hard or soft switched. Based on this determination, the control logic circuit 250 enables the Miller plateau detection circuit 240 or the overcurrent detection circuit 260. Due to the nature of soft/hard switching modes, during this time, the voltage at the node 208 may depend on the ratio of the parasitic capacitors 220, 230. For instance, during hard-switching mode, the voltage at the node 120 may be +$V_{DC}$. As noted above, during the instant when the control logic circuit 250 detects the mode of switching, both the high side IGBT 122 (FIG. 1(*a*)) and the low side IGBT 132 are open, the voltage at the node 208 may depend on the parasitic capacitors 220, 230 and the voltage at the node 120 at that instant. If the voltage at the node 208 is higher than a reference value provided to the comparator 196 (e.g., 0V), this may indicate the presence of a hard-switching scenario. However, if the voltage at the node 208 is lower than the reference value, this would indicate the presence of a soft-switching scenario. As described above, based on the mode of operation (hard or soft-switching), the enable/disable circuit 252 may enable/disable the corresponding circuit (e.g., if a hard switching scenario is present, the Miller plateau detection circuit 240 is enabled and the overcurrent detection circuit 260 is disabled, and if a soft switching scenario is present, the Miller plateau detection circuit 240 is disabled and the overcurrent detection circuit 260 is enabled.)

Figure 3A:
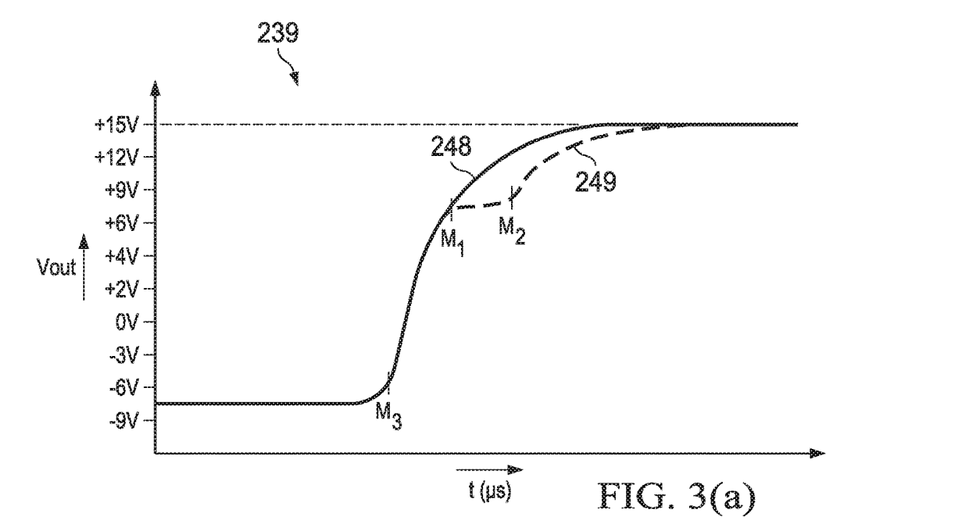
FIG. 3(a) depicts a graph plotting a first curve and a second curve, in accordance with various examples.

FIG. 3(*a*) depicts a graph 239 plotting a first curve 248 and a second curve 249. FIG. 3(*a*) is now described in tandem with FIGS. 1(*b*) and 1(*c*). Following identifying that the low side IGBT 132 is to turn on in the hard-switching mode and enabling the Miller plateau detection circuit 240, the control logic circuit 250 may signal to the circuit controlling pin 7 to increase the gate signal. Under no-fault conditions, due to the presence of parasitic capacitors 220, 230, the increase in the gate signal by pin 7 may first increase the charge in the parasitic capacitance 230. While charging the parasitic capacitor 230, a threshold voltage may be reached. During this instant, the charging of the parasitic capacitor 220 may become dominant, which may lead to the formation of the Miller plateau region (or Miller region) extending from M1 to M2 (depicted in the curve 249.) However, during a fault condition, the low side IGBT 132 may act as an RC circuit. Therefore, when the gate signal is provided by pin 7, the low side IGBT may act as a single capacitor and therefore may charge as shown by the curve 248. Thus, the presence of a Miller plateau region may indicate that the IGBT 132 is being turned on in the hard-switching mode under normal (i.e., no-fault) conditions. However, the absence of a Miller plateau region may indicate that the IGBT 132 is being turned on in the hard-switching mode under a fault condition.

Figure 3B:
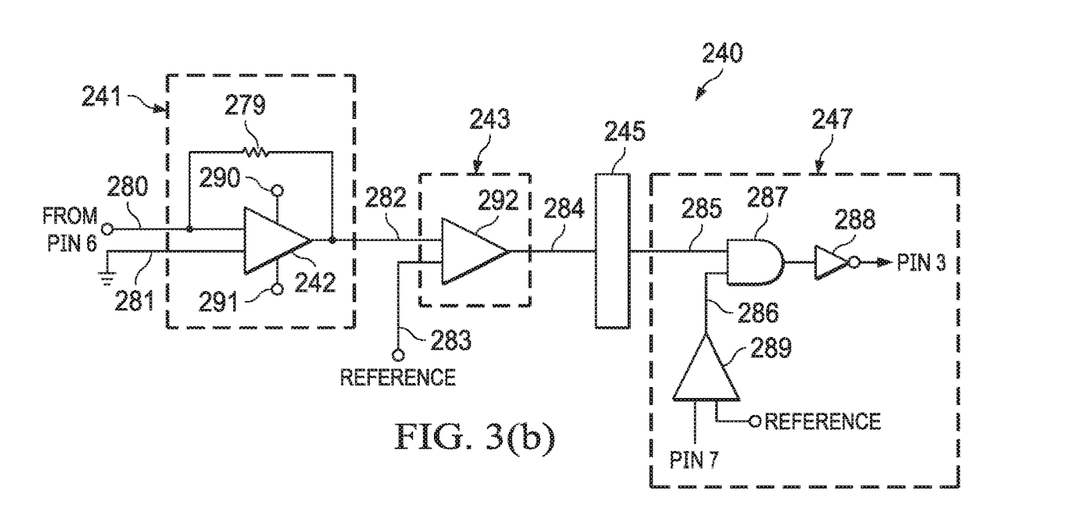
FIG. 3(b) depicts an illustrative Miller plateau detection circuit, in accordance with various examples.

Now refer to FIG. 3(*b*), which depicts an illustrative Miller plateau detection circuit 240 that may be used in the gate sense circuit 210. FIG. 3(*b*), now described in tandem with FIG. 1(*b*), depicts one of the techniques that may be used to detect a Miller plateau region. In other examples, different circuitry may be employed. The Miller plateau detection circuit 240 may include circuitry that may be able to detect a slope change in the input signal. The circuit 240 may include a differentiator circuit 241, a comparator circuit 243 coupled to the differentiator circuit 241 via the wire 282, a counter 245 coupled to the comparator 243 via the wire 284, and a logic control circuit 247 coupled to the counter 245 via the wire 285. The differentiator circuit 241 may include a differentiator 242 that may be configured to receive the signal ("input signal") from pin 6, i.e., the signal at the node 208 that is sensed by pin 6 via the wire 280. The differentiator 242 may receive a ground potential as the other input. The differentiator may generate an output via the wire 282 that is coupled to the wire 280 through the resistor 279. The differentiator 242 may also receive power through nodes 290, 291. The wire 282 may couple to the input of the comparator 292. The comparator 292 may be configured to receive a reference signal through the wire 283. The comparator 292 may generate its output via the wire 284 that is coupled to the counter 245. The logic control circuit 247 may include a logic gate 287, a comparator 289, and a logic gate 288 (e.g., NOT gate). The comparator 289 may be configured to receive the signal at pin 7 and compare it to a reference value. Based on the comparison done by the comparator 289, it may generate an output via the wire 286, which further couples to the logic gate 287. The output of the logic gate 287 may couple to the logic gate 288. The logic gate 287 may also receive the output of the counter 245 via the wire 285. The logic gate 288, based on the output of the logic gate 287, may signal a digital high ("1") indicating a fault condition or a digital low ("0") to the pin 3.

In operation (assuming normal, no-fault conditions), the differentiator 242 may differentiate the input signal to find slope of the input signal at pin 6 during the time the gate signal is being provided to the gate terminal 134. The differentiator 242 may output a signal to the comparator 292 indicating a slope change in the input signal. In some examples, the input signal between M3 and M1 (FIG. 3(*a*)) may not be linear (i.e., have a constant slope) and may include a small slope change. The time constant of the differentiator is designed such that to accommodate these changes Therefore, an input signal slope change that is higher than a reference value may be identified. For instance, the slope change in curve 249 (FIG. 3(*a*)) at M1 is high. In some examples, the comparator 292, during this instant, may generate a signal that would increase a count in the counter 245.

Figure 4A:
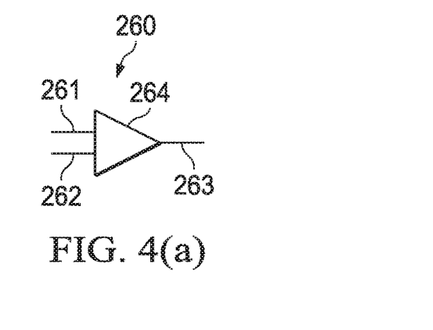
FIG. 4(a) depicts an illustrative overcurrent detection circuit, in accordance with various examples.

The region between time instances M1 and M2 may define the Miller plateau region. From M1 to M2, there may not be a change in the slope. At M2, however, the slope may change and be higher than the reference signal provided to the comparator 292. The comparator 292, during this instant, may again increase the count in the counter 245. If the final count value in the counter 245 is at least two (referring to M1 and M2), the logic control circuit 247 may receive a logic high ("1") via the wire 285 and if the final count value in the counter is less than 2, the logic control circuit 247 receives a logic low ("0") via the wire 285. The logic control circuit 247 may also compare, using the comparator 289, the signal at pin 7 (i.e., the gate signal being provided to the IGBT 132) with a reference value (e.g., 12V). For instance, the reference value at the comparator 289 may be 12V and the miller plateau region may occur at 11V. The output of the comparator 289 may be digital low ("0") for a gate voltage at pin 7 lower than 12V. However, when the voltage at pin 7 is higher than the reference signal, the comparator 289 may signal digital high ("1") at wire 286. Based on the signal received by the counter 245, the logic gate 287 may signal digital high ("1") indicating that a miller plateau region is present. However, if the count value in the counter 245 is less than two, the counter 245 may generate a digital low ("0") output at the wire 285 indicating the absence of the miller plateau region. In such a case, the logic gate 287 may generate a digital low output, which may further send a digital high (fault condition) output through the logic gate 288 to pin 3. Refer now to FIG. 4(a), which depicts an illustrative overcurrent detection circuit 260. The overcurrent detection circuit 260 includes a comparator 264 that may receive an input 261 and generate an output 263. Input 262 receives a reference signal. In operation, during a soft switch condition, input 261 may receive the voltage at the node 208 (FIG. 1(b)), which may be equivalent of the voltage drop across the diode 133 divided by the parasitic capacitance ratio. Voltage drop across diode 133 may be a function of current. Assume that during normal operating conditions the drop across the diode 133 is 2V. Under fault conditions, the drop may be greater than 2V. If the voltage at the node 208 is lower than the reference value at input 262, the comparator 264 may generate a fault signal (e.g., logic high) at output 263 (and, in turn, at pin 3). In some examples, turning pin 3 high may prompt turning-off of the IGBT 132. If the voltage at the node 208 is within a predetermined range of reference value at input 262, the comparator 264 may generate a no-fault signal (e.g., logic low) at output 263 (and, in turn, at pin 3). This will be considered as soft switch condition with normal currents. During a hard-switch condition, input 261 may receive the voltage at the node 208 (FIG. 1(b)), which may be equivalent of the voltage at node 120 divided by the parasitic capacitance ratio. If the voltage at the node 208 is higher than the reference, the output 263 (along with control logic circuit 250) may be configured as a hard-switching scenario. Control logic circuit 250, in such a scenario, may enable the Miller plateau detection circuit 240.

Figure 4B:
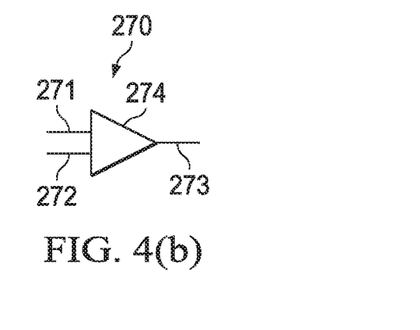
FIG. 4(b) depicts an illustrative overshoot detection circuit, in accordance with various examples.

Refer now to FIG. 4(b), which depicts an illustrative overshoot detection circuit 270. The overshoot detection circuit 270 includes a comparator 274 that may receive an input 271 and generate an output 273. Input 272 receives a reference signal. In some examples, the reference value may be the supply voltage at pin 8. In other examples, the reference value may be the gate voltage that is supplied by pin 7. In operation, during a steady state condition, input 271 may receive the voltage at the node 208 (FIG. 1(b)). The voltage at node 208 may be substantially equal to the voltage at pin 7 during normal steady state condition. During fault conditions, the voltage between collector terminal 135 and emitter terminal 136 may rise sharply, which may result in current flow in the parasitic capacitors 220 between the collector terminal 135 and gate terminal 134. This current flow may result in voltage rise across the parasitic capacitor 230 between the gate terminal 134 and the emitter terminal 136. If the voltage at the node 208 is equal to or higher than the reference value at input 272, the comparator 274 may generate a fault signal at output 273 (and, in turn, signal pin 3 to turn high). In some examples, turning pin 3 high may prompt turning-off of the IGBT 132. Conversely, if the voltage at node 208 is less than the reference value at input 272, the comparator 274 may generate a no-fault signal at output 273, which, in turn, signals pin 3 to turn low.

Figure 5A:
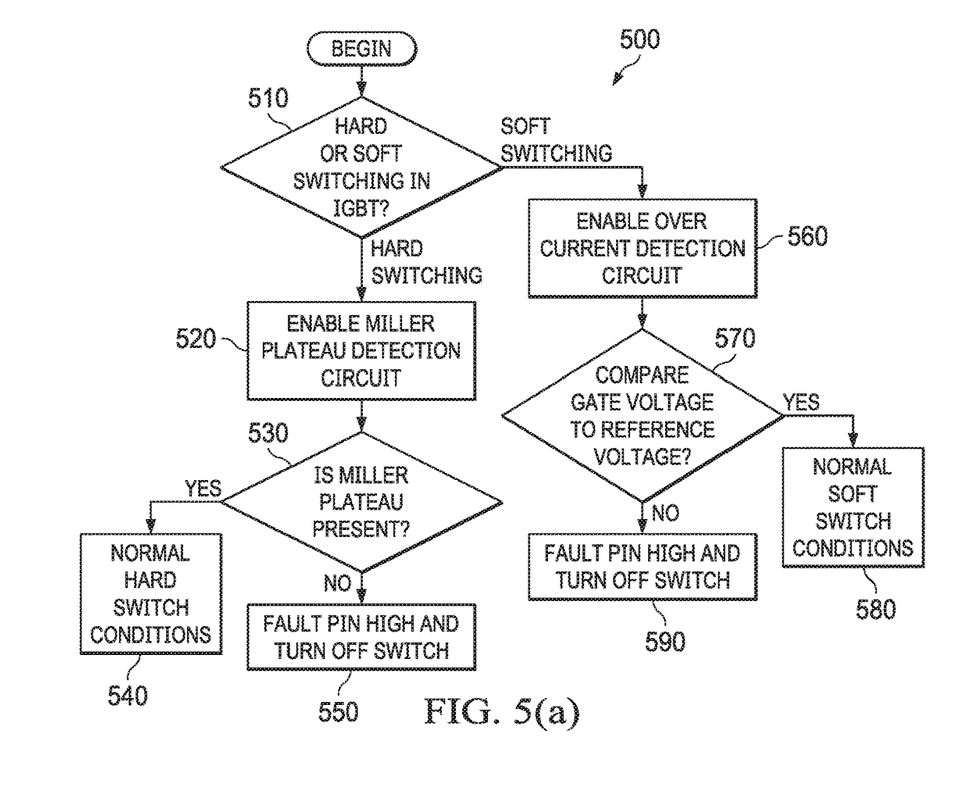
FIG. 5(a) depicts an illustrative method employed the gate sense circuit, in accordance with various examples.

FIG. 5(a) is now described in tandem with FIGS. 1(b) and 1(c). FIG. 5(a) depicts an illustrative method 500 that may be employed by the gate sense circuit 210 to detect a fault (e.g., short circuit) conditions during soft- and hard-switching modes. At least some of the steps depicted in FIG. 5(a) may occur before the low side IGBT 132 is turned on by the gate signal provided by pin 7 to the gate terminal 134. Before turning on the low side IGBT 132, the control logic circuit 250 may initiate identifying the nature of the switching (hard- or soft-switching) that may occur in the low side IGBT 132 (step 510). As described with respect to FIG. 2, the control logic circuit 250 does so by momentarily tri-stating pin 7, meaning that no gate signal can be sent (for a brief time) from pin 7 to the gate terminal 134. Following tri-stating pin 7, the signal at the node 208 may be monitored by the control logic circuit 250. For the sake of explanation, assume that the control logic circuit 250 identifies the low side IGBT 132 as being hard-switched. The method 500, in such a scenario, proceeds to step 520, which enables the Miller plateau detection circuit 240. The control logic circuit 250 may enable the Miller plateau detection circuit 240 by sending a control signal to the Miller plateau detection circuit 240. Since it is determined that the IGBT 132 is being hard-switched (step 510), the control logic circuit 250 may remove the tri-stating condition at pin 7, which may allow the circuit coupled to pin 7 to send a gate signal to the gate terminal 134. As the Miller plateau detection circuit 240 is enabled (step 520), the circuit 240 may begin sensing the signal from the node 208. If the Miller plateau detection circuit 240 identifies the presence of a Miller plateau (step 530), the method 500 may proceed to the step 540. Proceeding to step 540 may mean that the low side IGBT 132 is functioning in a normal condition, i.e., being hard-switched without a fault. On the other hand, if the Miller plateau detection circuit 240 identifies the absence of a Miller plateau (step 530), a fault condition is present. Accordingly, in step 550, the Miller plateau detection circuit 240 may turn pin 3 high, indicating a fault condition and further notifying the circuit coupled to pin 7 to turn-off the IGBT 132. The IGBT may be turned OFF either like normal turn off or through soft shot down technique wherein the gate to emitter voltage is gradually reduced.

Now assume that the control logic circuit 250 in step 510 identifies the low side IGBT 132 as being soft-switched. In this case, the method 500 proceeds to step 560, in which the control logic circuit 250 enables the overcurrent detection circuit 260. As the overcurrent detection circuit 260 is enabled, the circuit 260 may begin sensing the signal at the node 208. If the overcurrent detection circuit 260 identifies the voltage at the node 208 as being higher than the reference voltage (step 570), the method 500 may proceed to the step 580, which may mean that the low side IGBT 132 is functioning in a normal condition, i.e., the low side IGBT 132 is being soft-switched without a fault. If the voltage at the node 208 is lower than the reference voltage, a fault condition is present. Accordingly, in step 590, the overcurrent detection circuit 260 may turn pin 3 high, indicating a fault condition and further notifying a circuit driving pin 7 to turn-off the IGBT 132. In some examples, the IGBT 132 may be normally turned-off or through soft shot down technique wherein the gate to emitter voltage is gradually reduced.

Figure 5B:
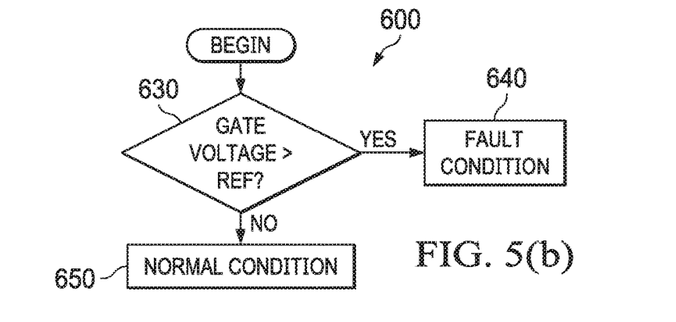
FIG. 5(b) depicts an illustrative method performed by the overshoot detection circuit 270, in accordance with various examples.

FIG. 5(b), now described in tandem with FIGS. 1(b) and 1(c), depicts an illustrative method 600 that may be performed by the overshoot detection circuit 270 during a steady state condition, i.e., when the low side IGBT 132 is turned on and is functioning in a normal, no-fault condition. As noted above, the overshoot detection circuit 270 may receive the signal from pin 6. The method 600 proceeds with the overshoot detection circuit 270 determining whether the gate voltage at the node 208 is higher than a reference voltage (step 630). If the gate voltage at node 208 is higher than or equal to the reference voltage, the method 600 may proceed to step 640, in which a fault condition is identified and which includes turning pin 3 high and notifying the control logic circuit 250 to initiate turning off the low side IGBT 132. The IGBT may be turned OFF either like normal turn off or through soft shot down technique wherein the gate to emitter voltage is gradually reduced. On the contrary, if the voltage at the node 208 is lower than the reference voltage, the method 600 may proceed to step 650, meaning that there is no fault and the low side IGBT 132 is functioning in a normal condition.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A gate driver, comprising:
   a gate sense pin; and
   a gate sense circuit to couple to a node of a transistor via the gate sense pin, the gate sense circuit comprising:
      an overcurrent detection circuit configured to detect a first fault condition based on a voltage of the node before the transistor turns on in a soft switching mode; and
      a Miller plateau detection circuit configured to detect a second fault condition based on the voltage of the node when the transistor is turning on in a hard switching mode.

2. The gate driver of claim 1, wherein, in response to the detection of the first fault condition, the overcurrent detection circuit sends a fault signal to a fault pin of the gate driver.

3. The gate driver of claim 1, wherein in response to the detection of the second fault condition, the Miller plateau detection circuit sends a fault signal to a fault pin of the gate driver.

4. The gate driver of claim 1, wherein the gate sense circuit includes:
   an overshoot detection circuit configured to detect a third fault condition based on the voltage of the node when the transistor is in a steady state mode.

5. The gate driver of claim 4, wherein the overcurrent detection circuit detects the voltage at the node to detect the first fault condition, the voltage at the node depending on first and second parasitic capacitors.

6. The gate driver of claim 1, wherein the gate sense circuit includes a control logic circuit configured to determine whether the transistor is in the soft switching mode or the hard switching mode when an output pin is blocked.

7. The gate driver of claim 6, wherein the Miller plateau detection circuit detects the second fault condition based on a presence of a Miller plateau region in a signal at the node.

8. The gate driver of claim 1, wherein the overcurrent detection circuit comprises a comparator.

9. A system, comprising:
   a transistor comprising a gate terminal, a collector terminal, and an emitter terminal, wherein the transistor comprises a first parasitic capacitor between the gate and the emitter terminals and a second parasitic capacitor between the gate and the collector terminals, wherein the first and second parasitic capacitors couple at a node; and
   a gate driver comprising an output pin and a gate sense pin, wherein the output pin couples to the gate terminal and the gate sense pin couples to the output pin and the gate terminal at the node, wherein the gate driver comprises a control logic circuit configured to determine whether the transistor is in a hard switching mode or a soft switching mode based on a signal at the node.

10. The system of claim 9 further comprising a Miller plateau detection circuit that detects a fault condition while the transistor is turning on in the hard switching mode by monitoring for an absence of a Miller plateau region in the signal, wherein, in response to the detection of the fault condition, the Miller plateau detection circuit sends a fault signal to a fault pin.

11. The system of claim 10, wherein the Miller plateau detection circuit monitors a change of slope of the signal at the node.

12. The system of claim 10, wherein the Miller plateau detection circuit comprises a differentiator.

13. The system of claim 12, wherein the signal at the node depends on first and second parasitic capacitors.

14. The system of claim 9 further comprising an overcurrent detection circuit that detects a first fault condition when the transistor is in the soft switching mode by monitoring the signal at the node, wherein, in response to the detection of the first fault condition, the overcurrent detection circuit sends a fault signal to a fault pin.

15. The system of claim 9 further comprising an overshoot detection circuit that detects a fault condition when the transistor is in a steady state mode by monitoring the signal at the node, wherein, in response to the detection of the fault condition, the overshoot detection circuit sends a fault signal to a fault pin.

16. The system of claim 9, wherein the control logic circuit is configured to determine whether the transistor is in the hard switching mode or the soft switching mode when the output pin is blocked.

17. The system of claim 9, wherein the gate driver comprises no more than 8 pins.

18. A method, comprising:
   blocking an output pin of a gate driver using a control logic circuit present in the gate driver;
   comparing, using the control logic circuit, a signal at a node to a first reference value, wherein the node is coupled to the output pin, a gate of a transistor, and a gate sense pin of the gate driver;
   enabling a Miller plateau detection circuit in response to the signal being higher than the first reference value;

detecting an absence of a Miller plateau region in the signal at the node using the Miller plateau detection circuit; and in response to the detection of the absence of the Miller plateau region, providing a first fault signal to a fault pin of the gate driver by the Miller plateau detection circuit.

19. The method of claim 18 further comprising:

in response to the signal being lower than the first reference value, enabling an overcurrent detection circuit;

comparing, using the overcurrent detection circuit, the signal to a second reference value; and in response to the signal being less than the second reference value, providing a second fault signal to the fault pin by the overcurrent detection circuit.

20. The method of claim 19 further comprising:

enabling an overshoot detection circuit in a steady state condition;

comparing, using the overshoot detection circuit, the signal to a third reference value; and in response to the signal being less than the third reference value, providing a third fault signal to the fault pin by the overshoot detection circuit.

* * * * *